United States Patent [19]

Wilfley et al.

[11] Patent Number: 4,891,594

[45] Date of Patent: Jan. 2, 1990

[54] METHOD OF OPTIMIZING FLIP ANGLES IN MRI FOR UNEQUAL DELAY TIMES

[75] Inventors: Brian P. Wilfley, Los Gatos; Robert J. Perlmutter, Palo Alto, both of Calif.

[73] Assignee: Resonex, Inc., Sunnyvale, Calif.

[21] Appl. No.: 234,458

[22] Filed: Aug. 19, 1988

[51] Int. Cl.⁴ ............................................. G01R 33/20
[52] U.S. Cl. ..................................... 324/309; 128/653
[58] Field of Search ............... 324/309, 307, 310, 312, 324/314; 128/653

[56] References Cited

U.S. PATENT DOCUMENTS

| | | | |
|---|---|---|---|
| 4,509,015 | 4/1985 | Ordidge et al. | 324/309 |
| 4,710,717 | 12/1987 | Pelc et al. | 128/653 |
| 4,777,957 | 10/1988 | Wehrli et al. | 128/653 |
| 4,782,839 | 11/1988 | Hennig et al. | 324/309 |

OTHER PUBLICATIONS

P. Mansfield, *Magnetic Resonance Medicine* 1, 370–386, (1984), (only page 385 enclosed).

*Primary Examiner*—Michael J. Tokar
*Attorney, Agent, or Firm*—Flehr, Hohbach, Test, Albritton & Herbert

[57] ABSTRACT

In an MRI method for optimizing flip angles for unequal delay times, a mathematical relationship is derived where RF flip angles can be determined to provide output signals which are constrained to be equal in amplitude and maximized in a sequence of MRI imaging.

3 Claims, 2 Drawing Sheets

METHOD OF OPTIMIZING FLIP ANGLES IN MRI FOR UNEQUAL DELAY TIMES

The present invention is directed to optimizing radio frequency flip angles for unequal delay times in a magnetic resonance imaging (MRI) system, and more specifically, to provide multiple images where there are a series of radio frequency (RF) pulses and where interpulse delay times are variable.

BACKGROUND OF THE INVENTION

In an MRI system it is desired to make so-called movies of a human heart as it's beating. Naturally, the "R" heart pulses are normally used as the triggering point for these images. Then, by a sequence of RF pulses within a period of the heart beat, a sequence in time of images is taken. In accordance with well known MRI technique, this must be repeated over several heart beats; for example, as many as 128 or more times.

Because the heart rate of each individual being examined is unique, the foregoing technique must be adjusted to accommodate such heart rate since the "R" wave is used as a triggering point. If a gap is left between the last RF pulse in the sequence of RF pulses and the first RF pulse of the subsequent sequence, there is a longer relaxation period at this point. Because the magnetization has more time to relax towards equilibrium during this longer relaxation period, the image generated by the first RF pulse in the sequence will be brighter or appear to flash, compared to the remaining sequence of pictures used to make up the so-called heartbeat movie. This one picture can be rescaled but if this is done the problem of an unequal signal to noise ratio remains.

Another solution to the so-called "flash" problem is to provide a continuous train of RF pulses throughout the heart period and then reorder the data as necessary to approximate a trigger on the "R" wave. This is complex and may not fully compensate for all variations of unequal relaxation time between RF pulses.

OBJECT AND SUMMARY OF INVENTION

It is therefore a general object of the present invention to provide a method of optimizing flip angles in MRI for unequal delay times.

In accordance with the above object, there is provided a method of optimizing radio frequency (RF) flip angles in a magnetic resonance imaging (MRI) system where multiple sequential images in time are desired and the time between RF pulses may be unequal comprising the following steps. A mathematical relationship is determined relating the effect of flip angle in a sequence of RF pulses, with an unequal time between at least some of said pulses, to the magnitude of the RF output signals of the MRI system due to the RF pulses. Then the relationship is utilized to derive flip angles for each RF pulse of the sequence to provide output signals which are constrained to be equal in amplitude and maximized.

DESCRIPTION OF PREFERRED EMBODIMENT

Figure 1:
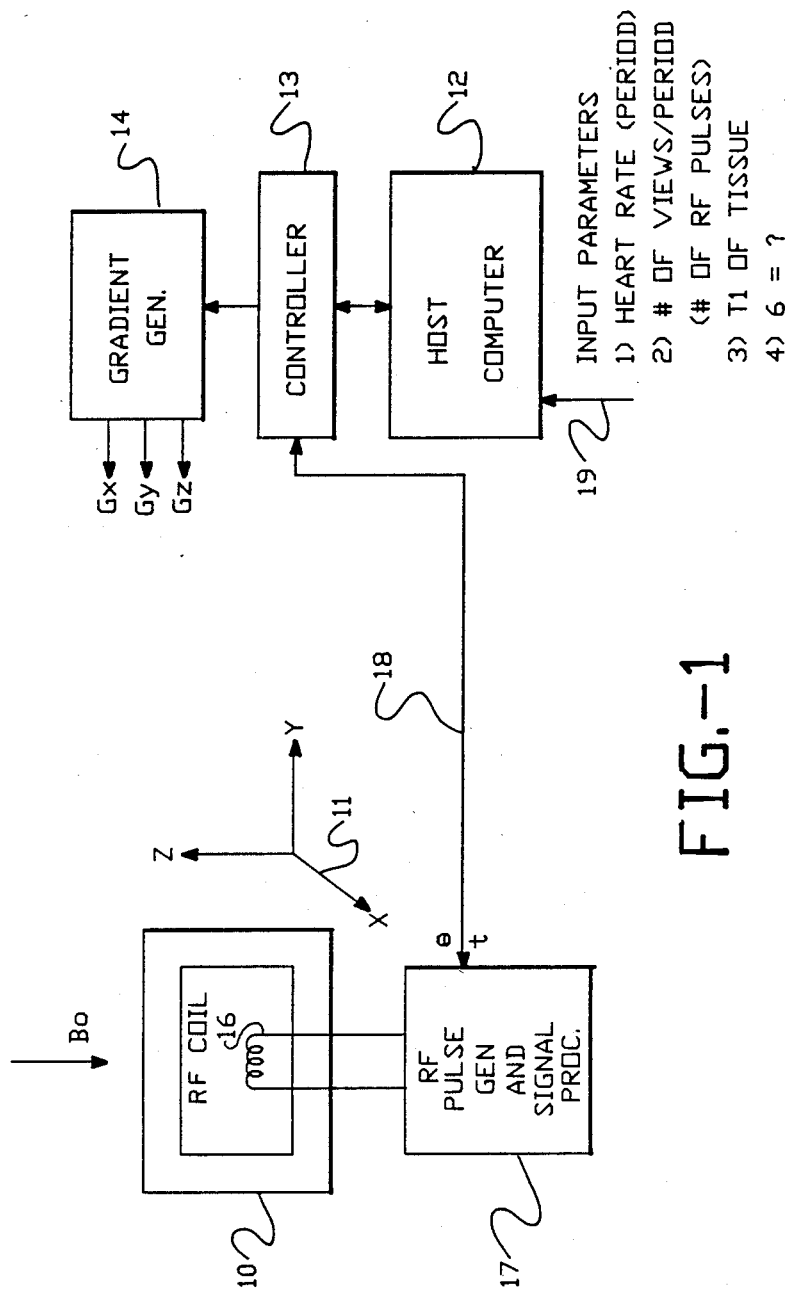
FIG. 1 is a block diagram of an MRI system embodying the present invention.

FIG. 1 illustrates an MRI system which, in its block diagram form, is of a standard type. However, with a properly programmed computer, the system can execute the process of the present invention.

A main magnet 10 provides a magnetic field, $B_0$, which generates the static magnetic field to polarize the nuclei of the specimen contained within the magnet 10. As shown by the associated three dimensional axis 11, this magnetic field is in the Z direction with the transverse direction being illustrated by the X and Y axes. A host computer 12 provides for overall control of the system. It drives the controller 13 which, in turn, drives the gradient generator 14, providing three orthogonal gradients.

Finally, the third component of the typical MRI system includes the radio frequency (RF) coil 16 which is used for generating a sequence of RF pulses in the subject or specimen being analyzed and for picking up output signals which may be of the free induction decay or spin echo type or a gradient recalled echo signal. In any case, the RF signals are both generated and processed by the unit 17 which is driven via line 18 by controller 13. Parameters of the RF pulse generator include the flip angle, $\Theta$, of the applied pulse and the time at which it is applied.

To practice the method of the present invention, host computer 12 has as input parameters shown at 19 the following: (1) heart rate (period of the heartbeat); (2) number of images or views to be taken per heart period and their acquisition times relative to the trigger at the "R" wave. (This determines the number of RF pulses to be utilized within each period.) (3) The $T_1$ or relaxation time of the tissue of the specimen being examined; typically, for a heart this is the myocardium tissue. (4) A signal amplitude $\sigma$ which will be determined as discussed below.

Figure 2A:
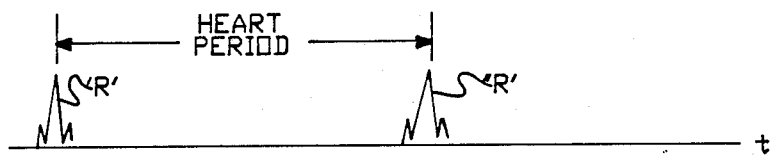
FIGS. 2A through 2E are timing diagrams useful in understanding the method of the present invention.
Figure 2B:
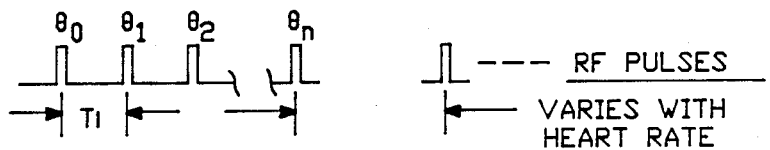

The timing diagrams of FIGS. 2A through 2E illustrate the specific application of the method of the present invention. FIG. 2A shows typical "R" wave pulses of a heart of a human patient having, of course, a variable heart period or rate. FIG. 2B illustrates an MRI scan where several views are acquired of the heart within a single heart period. The views are designated with the flip angles $\Theta_0$, $\Theta_1$ through $\Theta_n$ and the time between the RF flip angle through $\Theta_n$ and the time between the RF flip angle pulses is, of course, $\tau$. The unequal time occurs due to the necessary repetitive taking of information and occurs between the last sequence of repetitive pulses in the single heart period at the $\Theta_n$ pulse and the beginning of the next sequence, where the next "R" wave occurs. The foregoing is termed a "cine cardiac scan" which provides a heartbeat movie.

Figure 2C:
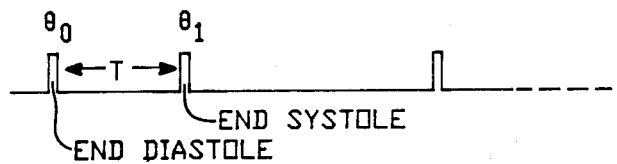

Next, FIG. 2C illustrates a scan consisting of images taken of the same slice at end diastole at the "R" wave and end systole.

Figure 2D:
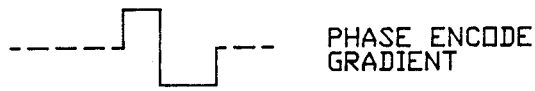
Figure 2E:
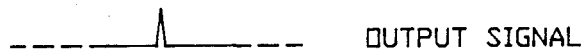

In order to provide an output signal, the present invention utilizes what is termed "gradient recalled echo," where a phase encode gradient, as illustrated in FIG. 2D, is inverted to provide an output signal after application of an RF pulse. And the output signal is indicated in FIG. 2E. Both of these figures are not in the proper time relationship with the others.

Finally, as discussed in the background of the invention, because of the unequal delay times illustrated in FIG. 2B, without the determination of optimum flip angles, as provided by the present invention, the image provided at the "R" wave would be brighter or flash compared to the remaining images in the cine cardiac sequence.

The method of the present invention is to, in effect, derive a mathematical relationship relating the effect of flip angles in a sequence of RF pulses with an unequal time between at least some of the pulses.

This is done, as shown in equation I (see equations page below), by writing an equation showing the evolution of the ratio of the longitudinal magnetization to the equilibrium magnetization, generally stated as "M", from just before the ith pulse to just before the i+1th pulse.

Figure 3:
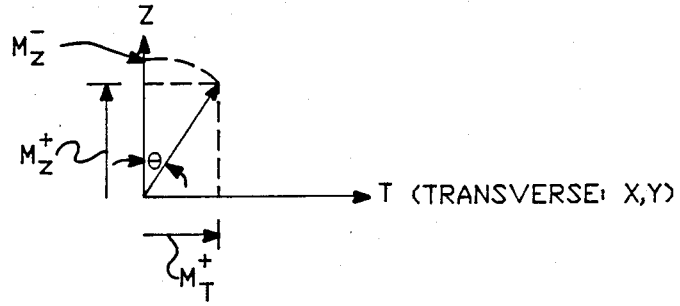
FIG. 3 is a vector diagram showing magnetization directions in relation to flip angle.

In accordance with the method of the present invention, where we constrain all signals as being equal, this is done by providing that the magnetic moment term M in equation 2 is equal to a constant divided by flip angle. Very briefly, referring to FIG. 3, this magnetic moment is in the longitudinal or Z direction, as illustrated in the figure and the flip angle, $\Theta$, is also designated.

Lastly, the final relationship of recursion equation 3 is produced by substitution into equation 1 and by rearrangement. Equation 3 has been analyzed and it has been found to converge when iterated, if $\sigma$ is chosen to have the proper value. Thus, in solving the equation initially, a guess is made as to the appropriate value of $\sigma$. And then the largest value of $\sigma$ is chosen, which represents the maximum signal attainable for a given time between pulses and relaxation time, but where the equation still converges.

Thus, the sequence of steps is: (1) initial guess for $\sigma$; (2) solve recursive equation and if diverges lower $\sigma$ value; (3) if converges raise $\sigma$ until achieve largest value that converges.

If a smaller $\sigma$ value is chosen that converges but is not maximized, this will not provide the highest signal to noise ratio. After solving for the proper value of $\sigma$, then the system of equations is solved with the desired values of flip angles. Such flip angles provide output signals which are constrained to be equal in amplitude and are maximized.

The following are two examples. The first is in relation to FIG. 2C, where a scan consisting of images at the same slice is taken at the times indicated, that is end diastole and end systole. The heart period is 0.8 seconds. The end diastolic image was acquired after the "R" wave and the end-systolic image 0.3 seconds later. The $T_1$ (the relaxation time) was equal to 0.6 seconds at 16 Megahertz. The resultant flip angles with a $\sigma$ of 0.565 were $\Theta_0$ equal to 53.9° and $\Theta_1$ equal to 61.4°.

The second example with relation to FIG. 2B is where 24 views are acquired at 30 millisecond intervals on a patient with a heart period of 0.9 seconds. This is a cine cardiac scan. The same T1 is assumed for the heart; the derived flip angles for the first and last RF pulses are $\Theta_0=17.0°$; and $\Theta_{23}=21.9°$. These flip angles increase monotonically from the first to the last. The maximum $\sigma$ is 0.176.

The iterative nature of the method of solution of equation 3 might initially seem difficult. However, in the cardiac examples above, only the, last delay time (see FIG. 2B) is uncertain. In practice, therefore, sets of flip angles can be precomputed several times within the anticipated range of variation of the last delay time. Then the real time task reduces deciding which set to use.

Thus, a technique for providing optimum flip angles for unequal delay times has been provided.

$$M_{i+1}^- = \cos\theta_i M_i^- e^{-\tau_i/T1} + (1 - e^{-\tau_i/T1}) \quad (1)$$

$$M_i^- = \frac{\sigma}{\sin\theta_i} \quad (2)$$

$$q_{i+1}^2 = \left( E_i q_i + \frac{1 - E_i}{\sigma} \right)^2 - 1 \quad (3)$$

where $E_i = e^{-\tau_i/T1}$ and $q_i = \cot\theta_i$.
$\tau_i$ = TIME BETWEEN RF PULSES
$\theta_1$ = FLIP ANGLE
$\sigma$ = AMPLITUDE of OUTPUT

What is claimed is:

1. A method of optimizing radio frequency (RF) flip angles in a magnetic resonance imaging (MRI) system where multiple sequential and equal RF output signals in time of a specimen are desired and the times between RF excitation pulses which provide said output signals may be unequal comprising the following steps:
   determining a mathematical relationship relating the effect of flip angle in a sequence of RF pulses, with an unequal time between at least some of said pulses, to the magnitude of the RF output signals of the MRI system due to said RF pulses; said relationship modeling effects of $T_1$, the relaxation time of said specimen,
   utilizing said relationship to derive flip angle durations for each RF pulse of said sequence to provide said output signals which are constrained to be equal in amplitude and maximized.

2. A method as in claim 1 where said relationship is:

$$q_{i+1}^2 = \left( E_i q_i + \frac{1 - E_i}{\sigma} \right)^2 - 1$$

where $E_i = e^{-\tau_i/T1}$ and $q_i = \cot\theta_i$.

and where $\tau_i$ are the times between RF pulses, $\Theta_i$, the flip angles and $\Theta$, the amplitude of said equal output pulses, and $T_1$ the longitudinal relaxation time of the specimen of the MRI system.

3. A method as in claim 2 where said relationship is solved by selecting a "$\sigma$" for which iterations of said relationship converge but are maximized and then solving for said flip angles.

* * * * *